United States Patent
Takemura

(10) Patent No.: US 9,443,844 B2
(45) Date of Patent: Sep. 13, 2016

(54) GAIN CELL SEMICONDUCTOR MEMORY DEVICE AND DRIVING METHOD THEREOF

(75) Inventor: Yasuhiko Takemura, Isehara (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 291 days.

(21) Appl. No.: 13/461,807

(22) Filed: May 2, 2012

(65) Prior Publication Data

US 2012/0287700 A1    Nov. 15, 2012

(30) Foreign Application Priority Data

May 10, 2011 (JP) ................. 2011-105132

(51) Int. Cl.
| | |
|---|---|
| *G11C 11/24* | (2006.01) |
| *H01L 27/06* | (2006.01) |
| *G11C 11/405* | (2006.01) |
| *H01L 27/108* | (2006.01) |
| *H01L 27/12* | (2006.01) |

(52) U.S. Cl.
CPC ......... *H01L 27/0688* (2013.01); *G11C 11/405* (2013.01); *H01L 27/108* (2013.01); *H01L 27/1207* (2013.01)

(58) Field of Classification Search
CPC . G11C 11/404; G11C 11/405; G11C 11/406; G11C 11/4074; G11C 11/4091; G11C 11/4087; H01L 27/0688; H01L 11/405; H01L 27/108; H01L 27/1207
USPC ................................ 365/149, 187
See application file for complete search history.

(56) References Cited

U.S. PATENT DOCUMENTS

| | | | |
|---|---|---|---|
| 4,375,600 | A | 3/1983 | Wu |
| 4,466,081 | A | 8/1984 | Masuoka |
| 4,630,088 | A | 12/1986 | Ogura et al. |
| 5,377,142 | A | 12/1994 | Matsumura et al. |
| 5,731,856 | A | 3/1998 | Kim et al. |
| 5,744,864 | A | 4/1998 | Cillessen et al. |
| 5,764,562 | A | 6/1998 | Hamamoto |

(Continued)

FOREIGN PATENT DOCUMENTS

| | | | |
|---|---|---|---|
| EP | 0175433 | A | 3/1986 |
| EP | 1737044 | A | 12/2006 |

(Continued)

OTHER PUBLICATIONS

Shukuri, "A Semi-Static Complementary Gain Cell Technology for Sub-1 V Supply DRAM's," IEEE Transactions on Electron Devices, vol. 41, No. 6, pp. 926-931, Jun. 1, 1994.

(Continued)

*Primary Examiner* — Thao H Bui
(74) *Attorney, Agent, or Firm* — Robinson Intellectual Property Law Office; Eric J. Robinson

(57) ABSTRACT

A memory cell including two transistors and one capacitor, which is known as a gain cell, is improved. One electrode of the capacitor is connected to a bit line, and the other electrode thereof is connected to a drain of a write transistor. A source of the write transistor is connected to a source line. As a result, for example, in the case where a stacked capacitor is used, the one electrode of the capacitor can be part of the bit line. Only one specific write transistor is turned on when a potential of the source line and a potential of the write bit line are set; thus, only one memory cell can be rewritten.

21 Claims, 9 Drawing Sheets

(56) References Cited

U.S. PATENT DOCUMENTS

| | | | |
|---|---|---|---|
| 5,802,000 A | 9/1998 | Hamada | |
| 6,016,268 A * | 1/2000 | Worley | G11C 11/565 365/149 |
| 6,127,702 A | 10/2000 | Yamazaki et al. | |
| 6,246,083 B1 | 6/2001 | Noble | |
| 6,294,274 B1 | 9/2001 | Kawazoe et al. | |
| 6,314,017 B1 | 11/2001 | Emori et al. | |
| 6,445,026 B1 | 9/2002 | Kubota et al. | |
| 6,536,013 B2 | 3/2003 | Kobayashi et al. | |
| 6,563,174 B2 | 5/2003 | Kawasaki et al. | |
| 6,727,522 B1 | 4/2004 | Kawasaki et al. | |
| 6,744,087 B2 | 6/2004 | Misewich et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,468,901 B2 | 12/2008 | Kameshiro et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,859,889 B2 | 12/2010 | Kameshiro et al. | |
| 7,935,582 B2 | 5/2011 | Iwasaki | |
| 7,956,361 B2 | 6/2011 | Iwasaki | |
| 8,320,162 B2 | 11/2012 | Inoue et al. | |
| 8,530,246 B2 | 9/2013 | Ofuji et al. | |
| 8,542,004 B2 | 9/2013 | Inoue et al. | |
| 8,742,412 B2 | 6/2014 | Goyal et al. | |
| 8,743,591 B2 | 6/2014 | Takemura | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0128803 A1 | 6/2005 | Luk et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0062068 A1 * | 3/2006 | Schlacter | G11C 14/00 365/222 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0193785 A1 | 8/2010 | Kimura | |
| 2011/0089414 A1 | 4/2011 | Yamazaki et al. | |
| 2011/0101351 A1 | 5/2011 | Yamazaki | |
| 2011/0122673 A1 | 5/2011 | Kamata et al. | |
| 2011/0134683 A1 | 6/2011 | Yamazaki et al. | |
| 2011/0199816 A1 | 8/2011 | Inoue et al. | |
| 2011/0210339 A1 | 9/2011 | Yamazaki et al. | |
| 2011/0227062 A1 | 9/2011 | Kato et al. | |
| 2011/0299344 A1 * | 12/2011 | Peng | G11C 17/18 365/189.2 |
| 2011/0317474 A1 | 12/2011 | Kato | |
| 2012/0275213 A1 | 11/2012 | Takemura | |

FOREIGN PATENT DOCUMENTS

| | | |
|---|---|---|
| EP | 2226847 A | 9/2010 |
| JP | 56-162875 A | 12/1981 |
| JP | 60-198861 A | 10/1985 |
| JP | 61-067953 A | 4/1986 |
| JP | 61-140172 A | 6/1986 |
| JP | 62-230043 A | 10/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 200-044236 A | 2/2000 |
| JP | 2000-150900 A | 5/2000 |
| JP | 2001-053164 | 2/2001 |
| JP | 2001-053167 A | 2/2001 |
| JP | 2001-230329 A | 8/2001 |

(56) References Cited

FOREIGN PATENT DOCUMENTS

| JP | 2001-351386 A | 12/2001 |
|---|---|---|
| JP | 2002-076356 A | 3/2002 |
| JP | 2002-093924 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-187940 A | 9/2011 |
| JP | 2012-238852 A | 12/2012 |
| WO | WO-2004/114391 | 12/2004 |
| WO | WO-2011/099389 | 8/2011 |

OTHER PUBLICATIONS

Hamamoto et al., "Cell-Plate-Line/Bit-Line Complementary Sensing (CBCS) Architecture for Ultra Low-Power DRAM's," IEEE Journal of Solid-State Circuits, vol. 31, No. 4, pp. 592-601, Apr. 1, 1996.
Kim et al., "An Experimental High-Density DRAM Cell with a Built-in Gain Stage," IEEE Journal of Solid-State Circuits, vol. 29, No. 8, pp. 978-981, Aug. 1, 1994.
Shukuri et al., "A Complementary Gain Cell Technology for Sub-1V Supply DRAMs," IEDM 92: Technical Digest of International Electron Devices Meeting, pp. 1006-1008, Dec. 13, 1992.
Ishii et al., "A Poly-Silicon TFT With a Sub-5-nm Thick Channel for Low-Power Gain Cell Memory in Mobile Applications," IEEE Transactions on Electron Devices, vol. 51, No. 11, pp. 1805-1810, Nov. 1, 2004.
Shukuri, "A Semi-Static Complementary Gain Cell Technology for Sub-1 V Supply DRAM's," vol. 41, No. 6, pp. 926-931, Jun. 1, 1994.
Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.
Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDFW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composited for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Micorscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Ozide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Taiwanese Office Action (Application No. 101115998) Dated May 16, 2016.

* cited by examiner

Prior Art

GAIN CELL SEMICONDUCTOR MEMORY DEVICE AND DRIVING METHOD THEREOF

BACKGROUND OF THE INVENTION

1. Field of the Invention

The present invention relates to a memory device including a semiconductor.

2. Description of the Related Art

A 1T1C DRAM which includes a memory cell including one transistor and one capacitor has no limit on the number of times of writing in principle, and can perform writing and reading at relatively high speed, thereby used in many kinds of electronic appliances (see Patent Document 1 and Patent Document 4). The 1T1C DRAM performs data reading in such a manner that accumulated charge is released to a bit line and a change in a potential is measured; therefore, the capacitance of the capacitor needs to be at a certain value or more. As a result, it becomes more and more difficult to keep necessary capacitance because of miniaturization of a circuit.

In contrast, in a gain cell DRAM which includes a memory cell including two transistors and one capacitor, an amount of charge can be amplified by a read transistor and the charge can be supplied to a bit line even when the capacitance of the capacitor is small; therefore, it is assumed that the capacitor can be made small (see Patent Document 2 and Patent Document 3).

FIG. 2 is a circuit diagram of a memory cell of a conventional gain cell DRAM. A memory cell 201 includes a write transistor 202 and a capacitor 203. A gate of the write transistor 202 is connected to a write word line 204. A drain of the write transistor 202 is connected to a bit line 205, a source of the write transistor 202 is connected to a first electrode (capacitor electrode) of the capacitor 203, and a second electrode of the capacitor 203 is connected to a read word line 208.

The source of the write transistor 202 and the first electrode of the capacitor 203 are connected to a gate of a read transistor 207. Further, a drain of the read transistor 207 is connected to the bit line 205 and a source of the read transistor 207 is connected to a source line 206.

In order that data is written in the memory cell 201, while a potential of the bit line 205 is at a value corresponding to the data, a potential of the write word line 204 is controlled so that the write transistor 202 is turned on; thus, the capacitor 203 is charged. Then, the potential of the write word line 204 is controlled, so that the write transistor 202 is turned off. At this time, a potential of a connection point (storage node SN) between the source of the write transistor 202 and the first electrode of the capacitor 203 has the value corresponding to the data.

In order that data is read from the memory cell 201, the bit line 205 is set to be in a floating state at a certain potential and a potential of the read word line 208 is controlled, so that the potential of the storage node SN is adjusted; thus, the state of the read transistor 207 is changed. At this time, when the read transistor 207 is on, the amount of charge accumulated in the bit line 205 is changed and the change in the potential of the bit line 205 is measured.

REFERENCE

Patent Document

[Patent Document 1] U.S. Pat. No. 5,802,000
[Patent Document 2] U.S. Pat. No. 7,468,901
[Patent Document 3] United States Patent Application Publication No. 2011/0101351
[Patent Document 4] U.S. Pat. No. 5,764,562

SUMMARY OF THE INVENTION

An object of an embodiment of the present invention is to provide a semiconductor memory device and another semiconductor device each of which has a structure simpler than that of a conventional one, driving methods thereof, or manufacturing methods thereof. Further, an object of an embodiment of the present invention is to provide a semiconductor memory device and another semiconductor device each of which has integration degree higher than that of a conventional one, driving methods thereof, or manufacturing methods thereof.

Further, an object of an embodiment of the present invention is to provide a semiconductor memory device and another semiconductor device each with power consumption lower than that of a conventional one, driving methods thereof, or manufacturing methods thereof. Furthermore, an object of an embodiment of the present invention is to provide a semiconductor memory device and another semiconductor device each of which can be manufactured through steps fewer than those of a conventional one, driving methods thereof, and manufacturing methods thereof.

Further, an object of an embodiment of the present invention is to provide a memory device having a novel structure or a method for driving the memory device. In particular, it is an object of an embodiment of the present invention to provide a memory device in which power consumption can be reduced and a driving method in which power consumption can be reduced.

The present invention will be described below; terms used in this specification are briefly described. First, when one of a source and a drain of a transistor is called a drain, the other is called a source in this specification. That is, they are not distinguished depending on the potential level. Therefore, a portion called a source in this specification can be alternatively referred to as a drain.

Further, when the expression "to be connected" is used in this specification, there is a case in which no physical connection is made in an actual circuit and a wiring is only extended. For example, in the case of a circuit including an insulated-gate field-effect transistor (MISFET), one wiring functions as gates of a plurality of MISFETs in some cases. In that case, one wiring which branches into gates may be illustrated in a circuit diagram. Even in such a case, the expression "a wiring is connected to a gate" may be used in this specification.

Note that the terms "equal", "same", and "identical" mean not only the state where the amounts, the shapes, or the like exactly match, but practically also means the state where the amounts, the shapes, or the like have allowable differences. For example, when a potential of a source is 0.1 V lower than a potential of a drain, this state is expressed as "the potential of the source and the potential of the drain are equal" as long as the difference in the potentials does not significantly disturb operation.

An embodiment of the present invention is a semiconductor memory device including a write bit line, a write word line, and memory cells. Each of the memory cells includes a write transistor, a read transistor, and a capacitor. In each of the memory cells, a gate, a drain, and a source of the write transistor are connected to the write word line, one electrode of the capacitor, and a source line, respectively.

Further, an embodiment of the present invention is a semiconductor memory device including a write bit line, a write word line, and memory cells. Each of the memory cells includes a write transistor, a read transistor, and a capacitor. In each of the memory cells, a gate of the write transistor is connected to the write word line, one electrode of the capacitor is connected to a drain of the write transistor, and the other electrode of the capacitor is connected to the write bit line.

The source line may be formed in parallel to the write bit line. Further, the capacitance of the capacitor of the memory cell may be one time to ten times the gate capacitance of the write transistor. In that case, the off-state resistance of the write transistor is preferably greater than or equal to $1 \times 10^{18} \Omega$.

An embodiment of the present invention is a method for driving either of the above-described semiconductor memory devices, in which potentials of the drain and the source of the write transistor immediately after one data (e.g., data "1") is written are equal to those immediately after another data (e.g., data "0") is written.

With the above structure, a semiconductor memory device and another semiconductor device each of which has a structure simpler than that of a conventional one, and driving methods thereof can be provided. Further, a semiconductor memory device and another semiconductor device each of which has integration degree higher than that of a conventional one, and driving methods thereof can be provided. A semiconductor memory device and another semiconductor device each with power consumption lower than that of a conventional one, driving methods thereof, and manufacturing methods thereof can be provided. Furthermore, a semiconductor memory device and another semiconductor device each of which can be manufactured through fewer steps than those of a conventional one, and driving methods thereof can be provided. Note that the effect of the present invention will be described in detail in the following embodiments.

DETAILED DESCRIPTION OF THE INVENTION

Figure 1:
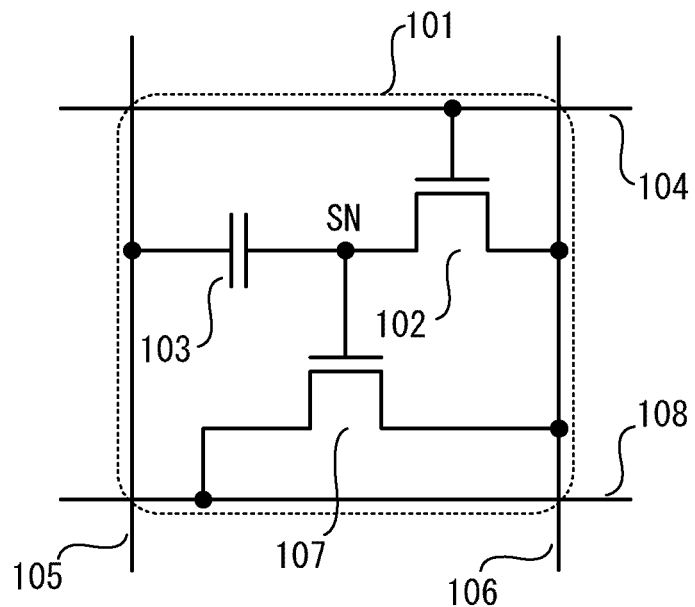
FIG. 1 is a circuit diagram illustrating an example of a semiconductor memory device of the present invention.
Figure 2:
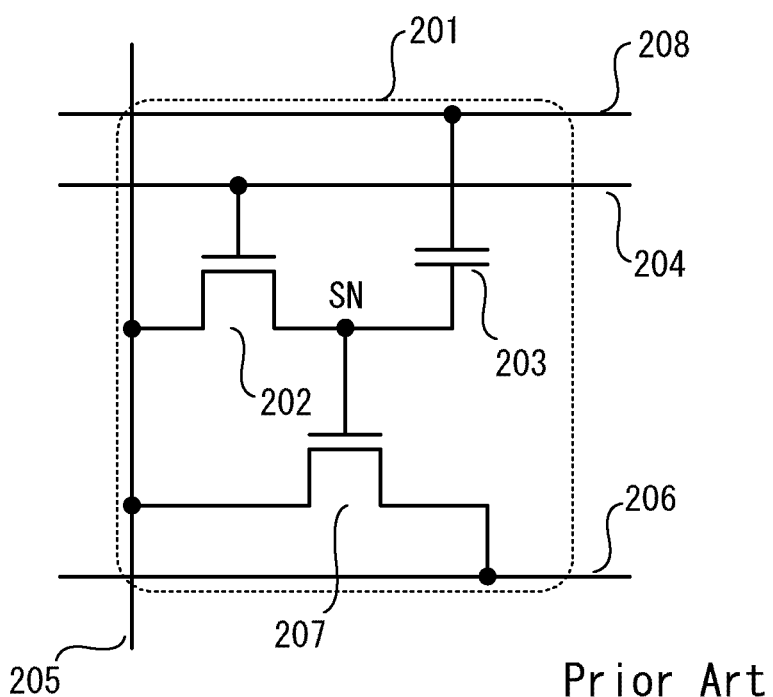
FIG. 2 illustrates an example of a conventional (gain cell) semiconductor memory device.

Hereinafter, embodiments will be described with reference to drawings. Note that the embodiments can be implemented with various modes, and it is easily understood by those skilled in the art that modes and details can be changed in various ways without departing from the spirit and scope of the present invention. Therefore, the present invention should not be interpreted as being limited to the following description of the embodiments.

In the accompanying drawings, a circle on a transistor indicates that the transistor is in an on state, and a cross on a transistor indicates that the transistor is in an off state. As for a read transistor, the state where a potential of a source and a potential of a drain are equal and thus current does not flow therebetween is also regarded as an off state in some cases.

Note that ones that have the same function, ones that are formed using the same material, or ones that are formed simultaneously are denoted by the same reference numerals in some cases. In the case where the ones denoted by the same reference numerals needs to be distinguished, "_1", "_2", and the like are added to the reference numerals in some cases. For example, when a plurality of read gates 112 is formed using the same material, the respective read gates are denoted by "112_1", "112_2", and the like in a drawing. In this specification, in some cases, the read gates are collectively denoted by a "read gate 112", while one of the read gates is denoted by a "read gate 112_1" in order that the one of the read gates is distinguished from the others.

(Embodiment 1)

FIG. 1 is a circuit diagram of a memory cell of a semiconductor memory device of this embodiment. A memory cell 101 includes one write transistor 102, one read transistor 107, and one capacitor 103. A gate of the write transistor 102 is connected to a write word line 104, and a source of the write transistor 102 is connected to a source line 106.

A first electrode of the capacitor 103 is connected to a drain of the write transistor 102. This node is referred to as a storage node SN. A second electrode of the capacitor 103 is connected to a write bit line 105.

A gate of the read transistor 107 is connected to the storage node SN, a drain of the read transistor 107 is connected to a read line 108, and a source of the read transistor 107 is connected to the source line 106. Note that the read line 108 is preferably arranged to be orthogonal to (intersecting with) the source line 106.

In FIG. 1, the source line 106 is provided in parallel to the write bit line 105; however, there is no limitation thereon, and the source line 106 may be provided in parallel to the write word line 104. When the source line 106 is provided in parallel to the write word line 104, wirings are effectively integrated. On the other hand, when the source line 106 is provided in parallel to the write bit line 105, on and off of the write transistor in every memory cell can be controlled independently for the reason described later.

Note that a method disclosed in Patent Document 1 can be used for providing the source line 106 in parallel to the write bit line 105, for example.

Next, examples of methods for writing data to and reading data from the memory cell 101 having the circuit configuration in FIG. 1 will be briefly described with reference to FIGS. 3A and 3B, FIGS. 4A and 4B, and FIGS. 5A and 5B. Note that although a specific value is given for a potential or the like in the following description for easy understanding, the present invention is not limited to such a value.

Here, a potential of the write bit line 105 is +1 V in the case of data "1", and the potential of the write bit line 105 is 0 V in the case of data "0". The write transistor 102 and the read transistor 107 are n-channel transistors. The threshold voltage of the write transistor 102 is +0.5 V and the threshold voltage of the read transistor 107 is +1 V. Note that the conductivity types of the write transistor 102 and the read transistor 107 can be set as appropriate. Here, the capacitance of the capacitor 103 is sufficiently larger than the gate capacitance of the read transistor 107. Parasitic capacitance or the like which is not illustrated is ignored.

A potential of the write word line 104 is sufficiently low (here, −1 V) so that the write transistor 102 is not turned on except in the case where writing is performed. First, the potential of the write bit line 105 is set to 0 V. At this time, a potential of the storage node SN is +1 V or 0 V, which is determined in accordance with (the potential of) written data. A potential of the source line 106 is set to +1 V and a potential of the read line 108 is set to +2 V.

In this state, the potential of the write word line 104 is increased to +2 V, so that the write transistor 102 is turned on. Then, the potential of the storage node SN becomes +1 V. At this time, the read transistor 107 is off (see FIG. 3A).

Next, the potential of the write bit line 105 is set to +1 V or 0 V in accordance with the data to be written. In this case, the potential of the storage node SN remains +1 V. However, since a potential difference between the electrodes of the capacitor 103 in accordance with the potential of the write bit line 105 is generated, charge in accordance with the potential difference is held in the first electrode of the capacitor 103 (see FIG. 3B).

After that, the potential of the write word line 104 is reduced to −1 V, so that the write transistor 102 is turned off. The charge held in the first electrode of the capacitor 103 is held in the storage node SN. This is the end of the write operation.

When the potential of the write bit line 105 is set to +2 V, the potential of the storage node SN is +2 V or +3 V. Then, the potential of the source line 106 is increased to +2 V, and the potential of the write word line 104 is increased from −1 V to +2 V (see FIG. 4A). Since the potential of the gate of the write transistor 102 (+2 V) is not higher than either the potential of the source or the potential of the drain, the write transistor 102 remains off. In other words, when both the potential of the write bit line 105 and the potential of the source line 106 are high, such as the case where the potential of the write bit line 105 and the potential of the source line 106 are +2 V, data cannot be written.

In the conventional gain cell memory, for rewriting data in one memory cell, when a potential of a write word line to which the memory cell is connected is increased, a write transistor in a different memory cell which is connected to the write word line is also turned on; therefore, these is a problem in that data held in the different memory cell is erased. This problem is difficult to be solved in the gain cell memory having the conventional structure. However, as is clear from the above description, in an embodiment of the present invention, unnecessary erasure of data in a memory cell can be prevented in such a manner that the potential of the write bit line 105 and the potential of the source line 106 provided in parallel to the write bit line 105 are set as appropriate.

Figure 3A:
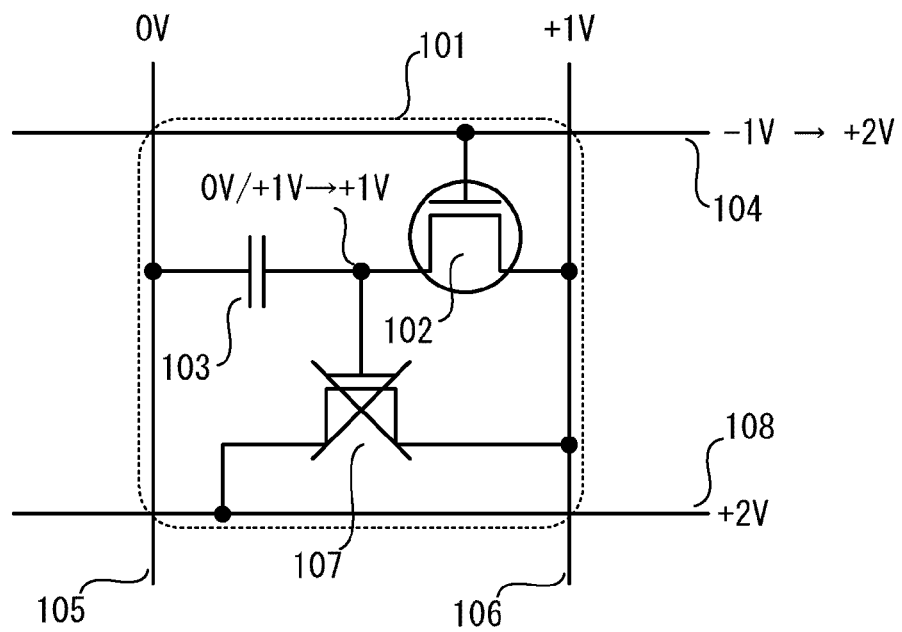
FIGS. 3A and 3B illustrate an example of a method for driving a semiconductor memory device of the present invention.
Figure 3B:
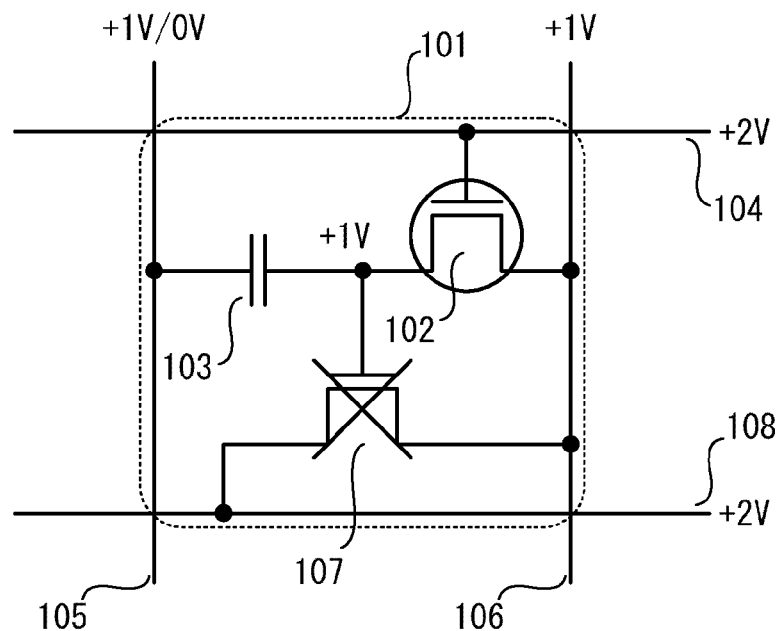
Figure 4A:
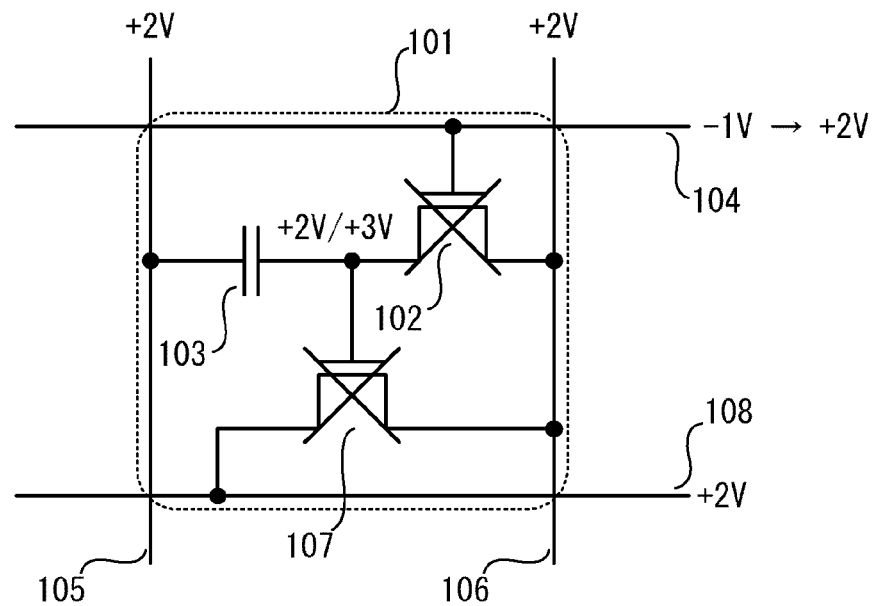
FIGS. 4A and 4B illustrate an example of a method for driving a semiconductor memory device of the present invention.
Figure 4B:
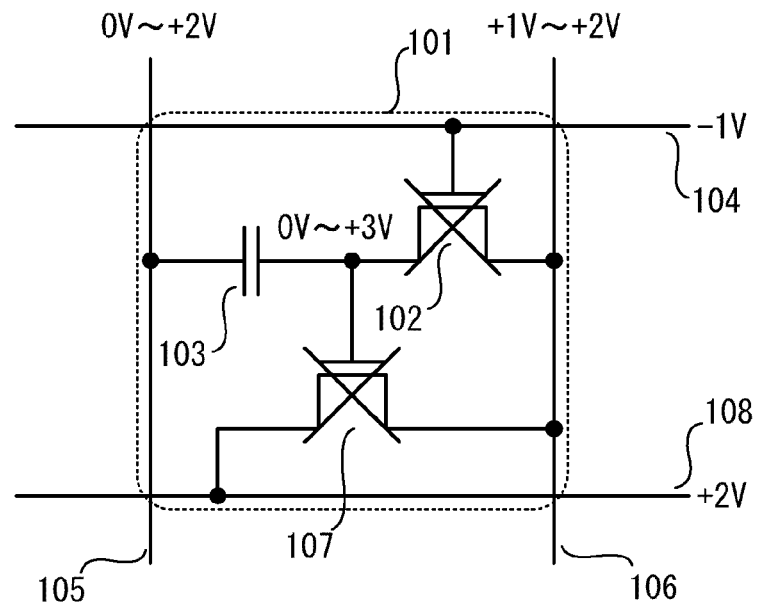
Figure 5A:
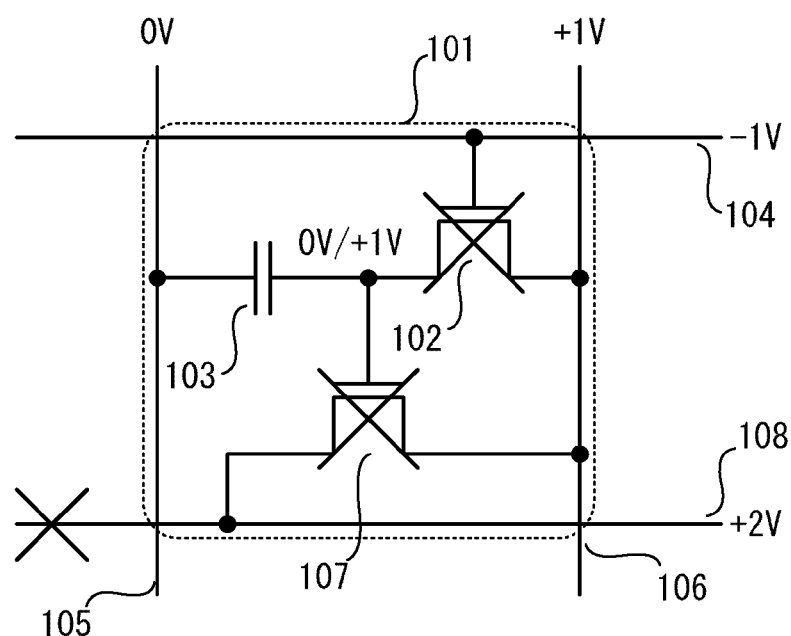
FIGS. 5A and 5B illustrate an example of a method for driving a semiconductor memory device of the present invention.
Figure 5B:
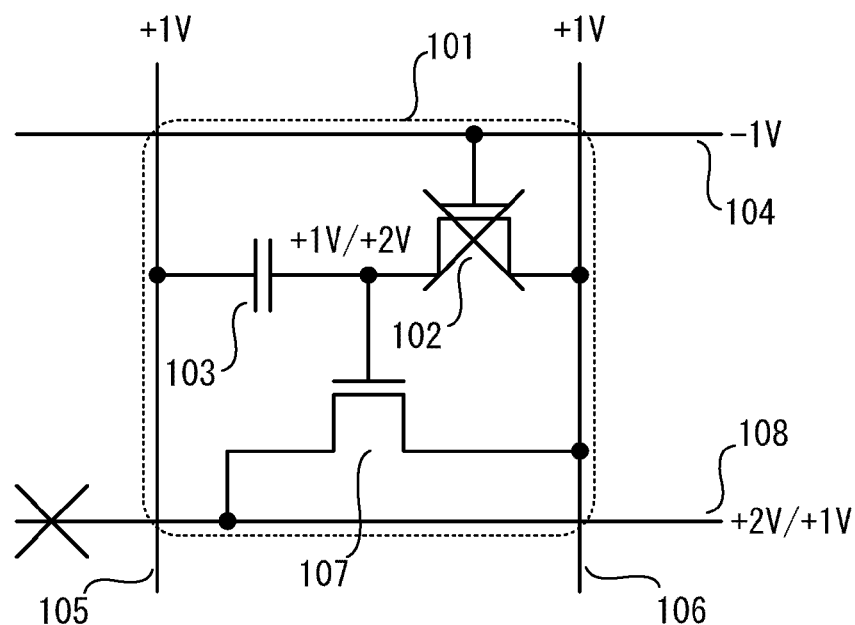

In other words, the potentials of the write bit line and the source line which are connected to the memory cell in which data is to be written are set low (the potential of the write bit line is 0 V and the potential of the source line is +1 V in the case of FIG. 3A), the potential of the write word line is set to a predetermined value (+2 V in the case of FIG. 3A), and then, the potential of the write bit line is set to the potential of the data; thus, data can be written.

On the other hand, when potentials of a write bit line and a source line which are connected to another memory cell are kept high (+2 V in the case of FIG. 4A), a write transistor is kept in an off state even in the case where the potential of the write word line becomes a specific value (+2 V); therefore, data is not erased in the memory cell.

The above is preferable in terms of reduction in power consumption. If data in a memory cell on which writing operation is not performed is erased, such as the case of the conventional method, the data needs to be restored; therefore, a potential of a bit line connected to the memory cell needs to be changed, which consumes power. However, as described above, only a potential of a write bit line to which a memory cell on which data rewriting is performed is connected is changed, so that power consumption can be significantly reduced.

When data writing is finished, the potential of the write word line 104 is kept at a sufficiently low potential (−1 V), as described above. In this state, the potential of the write bit line 105 changes in the range of 0 V to +2 V. For example, when the potential of the write bit line 105 is 0 V, since the write bit line 105 is capacitively coupled with the capacitor 103, the potential of the storage node SN is 0 V in the case where data "1" is written, and the potential of the storage node SN is +1 V in the case where data "0" is written. For this reason, the potential of the storage node SN is 0 V or +1 V when the potential of the write bit line 105 is 0 V in FIG. 3A.

Note that as the potential of the write bit line 105 is increased more, the potential of the storage node SN is increased accordingly. For example, when the potential of the write bit line 105 is +2 V, the potential of the storage node SN is +2 V or +3 V.

In other words, the potential of the storage node SN changes in the range of 0 V to +3 V. Further, the potential of the source line 106 is +1 V or +2 V. The potential of the read line 108 is kept at +2 V (see FIG. 4B). The potential of the storage node SN becomes +3 V only in the case where the potential of the write bit line 105 is +2 V. At this time, the potentials of the source line 106 and the write line 108 are +2 V; therefore, current does not flow between the source and the drain of the read transistor 107.

When the potential of the storage node SN is 0 V or +1 V, the read transistor 107 is off. When the potential of the storage node SN is +2 V and the potential of the source line 106 is +2 V, the read transistor 107 is also off. However, there is a case where the potential of the storage node SN is +2 V and the potential of the source line 106 is +1 V. In this case, the write transistor 107 is turned on, while the potential (+1 V), which is obtained by reducing the potential of the read bit line 108 having high potential (+2 V) by the threshold voltage, is output to the source line 106; therefore, current does not practically flow between the source and the drain of the read transistor 107.

Next, a method for reading data will be described. First, the potential of the write bit line 105 is set to a low potential (here, 0 V). Then, the potential of the storage node SN becomes 0 V or +1 V in accordance with the written data. The potential of the source line 106 is set to +1 V.

Next, either the read line 108 or the source line 106 is set to be in a floating state. Here, the read line 108 is set to be in a floating state and the potential thereof is +2 V. In this state, the read transistor 107 is in an off state (see FIG. 5A).

Further, the potential of the write bit line 105 is controlled, so that the state of the read transistor 107 is changed. Here, the potential of the write bit line 105 is set to +1 V. Then, the potential of the storage node SN becomes either +1 V or +2 V in accordance with the written potential.

In the case where the potential of the storage node SN is +1 V, the potential of the read line 108 remains +2 V. On the other hand, in the case where the potential of the storage node SN is +2 V, the potential of the read line 108 is reduced to +1 V. In other words, the potential of the read line 108 is +2 V in the case where data "1" has been written, and the potential of the read line 108 is +1 V in the case where data "0" has been written (see FIG. 5B). Thus, data can be read. Note that data cannot be erased in the above steps of data reading.

In the above example, although it is assumed that the capacitance of the capacitor 103 is sufficiently larger than the gate capacitance of the read transistor 107, as in the conventional gain cell memory, a semiconductor memory device of an embodiment of the present invention can perform a writing operation at higher speed by reducing the capacitance of the capacitor 103.

Note that in the case where the capacitance of the capacitor 103 is one time to ten times the gate capacitance of the read transistor 107, the potential of the storage node SN is affected by the state (on or off) of the read transistor 107 to be fluctuated, thereby not taking the above simple value.

Note that time until charge accumulated in the capacitor 103 (or the storage node SN) is released is proportional to the capacitance and the off-state resistance of the write transistor 102. Accordingly, in the case where the capacitance of the capacitor 103 is small, the off-state resistance of the write transistor 102 is increased accordingly, preferably increased to higher than or equal to $1 \times 10^{18} \Omega$.

(Embodiment 2)

In a memory cell of a semiconductor memory device of this embodiment, the conductivity type of the read transistor 107 in FIG. 1 is different from the conductivity type of the write transistor 102. For example, when the write transistor 102 is an n-channel transistor, the read transistor 107 is a p-channel transistor.

Examples of methods for writing data to and reading data from the semiconductor memory device of this embodiment will be briefly described with reference to FIGS. 6A to 6C and FIGS. 7A to 7C. Two memory cells 101_1 and 101_2 are illustrated in each of FIGS. 6A to 6C and FIGS. 7A to 7C. Data is input to the memory cell 101_1 through a write bit line 105_1, and data is input to the memory cell 101_2 through a write bit line 105_2. In an example described below, after data is written to the memory cell 101_1, the data is read from the memory cell 101_1 while data in the memory cell 101_2 is retained and is not read.

Specific values are given below as potentials and the like for easy understanding, but the present invention is not limited to the values. Here, a potential of the write bit line 105 in the case of data of "1" is +1 V, and the potential of the write bit line 105 in the case of data "0" is 0 V.

The threshold voltage of the write transistor 102 and that of the read transistor 107 are +0.5 V and −0.5 V, respectively. The capacitance of the capacitor 103 is sufficiently larger than the gate capacitance of the read transistor 107. In the example described below, data is written only to the memory cell 101_1 (the left memory cell) and data is not written to the memory cell 101_2 (the right memory cell).

A potential of the write word line 104 is sufficiently low (here, −1 V) so that the write transistor 102 is not turned on except in the case where writing is performed. First, a potential of the write bit line 105_1 is set to +1 V. A potential of the source line 106_1 is set to +1 V. At this time, as described in Embodiment 1, a potential of a storage node SN of the memory cell 101_1 is +2 V or +1 V, which is determined in accordance with (the potential of) written data.

A potential of the write bit line 105_2 is set to +2 V, and a potential of a source line 106_2 is set to +2 V. As described in Embodiment 1, a potential of a storage node SN of the memory cell 101_2 is +2 V or +3 V. A potential of the read line 108 is set to +1 V.

Figure 6A:
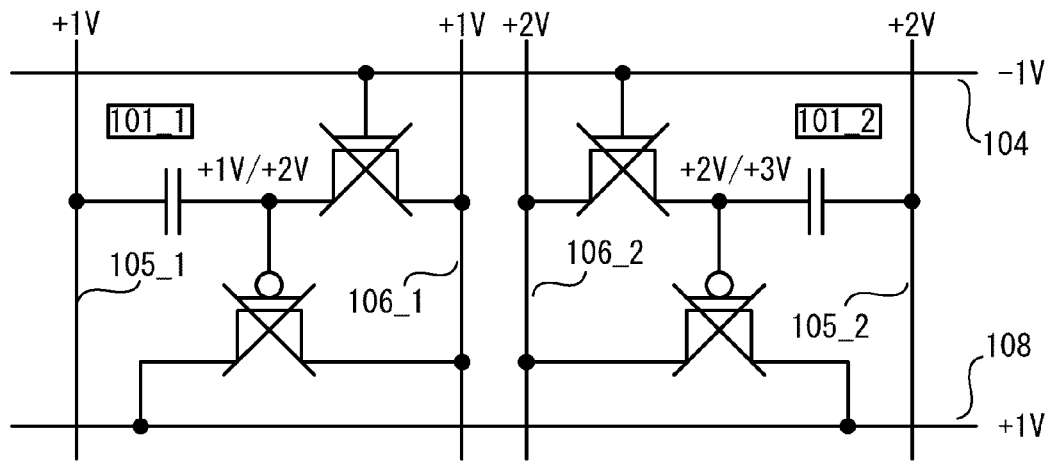
FIGS. 6A to 6C illustrate an example of a method for driving a semiconductor memory device of the present invention.
Figure 6B:
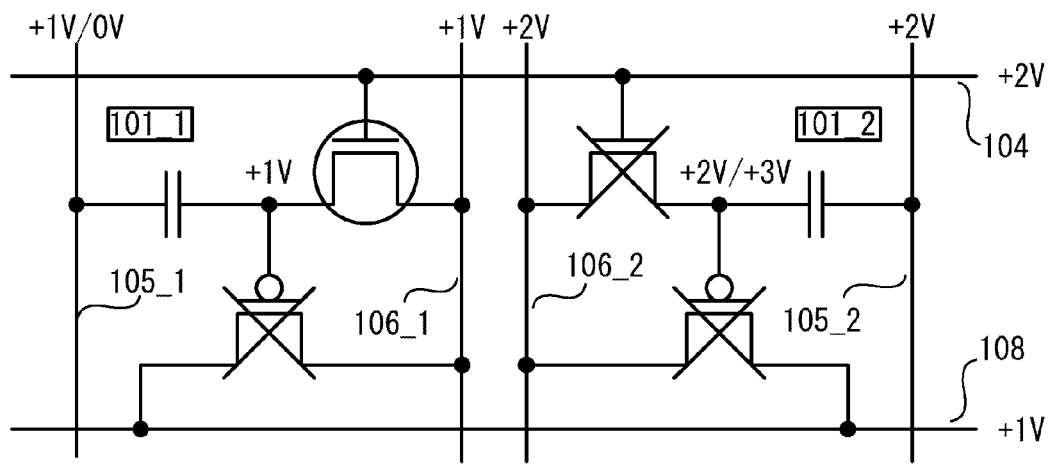
Figure 6C:
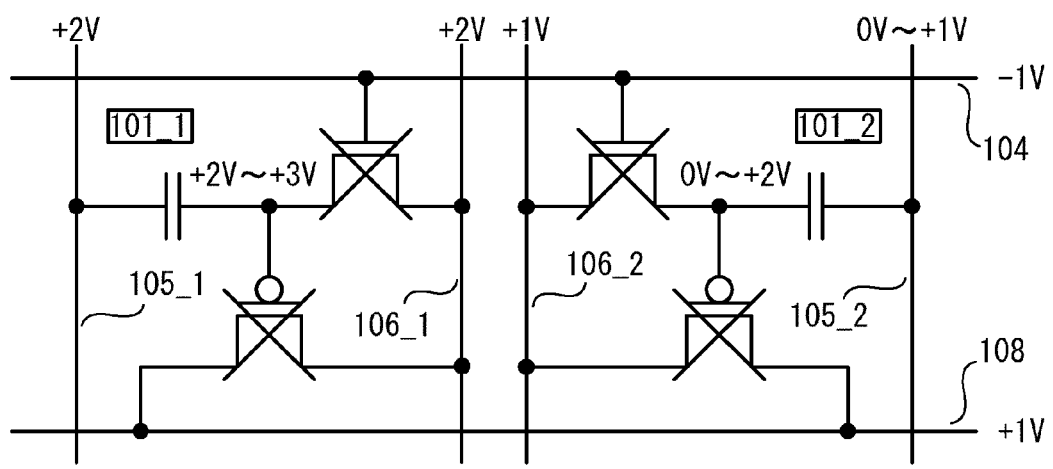
Figure 7A:
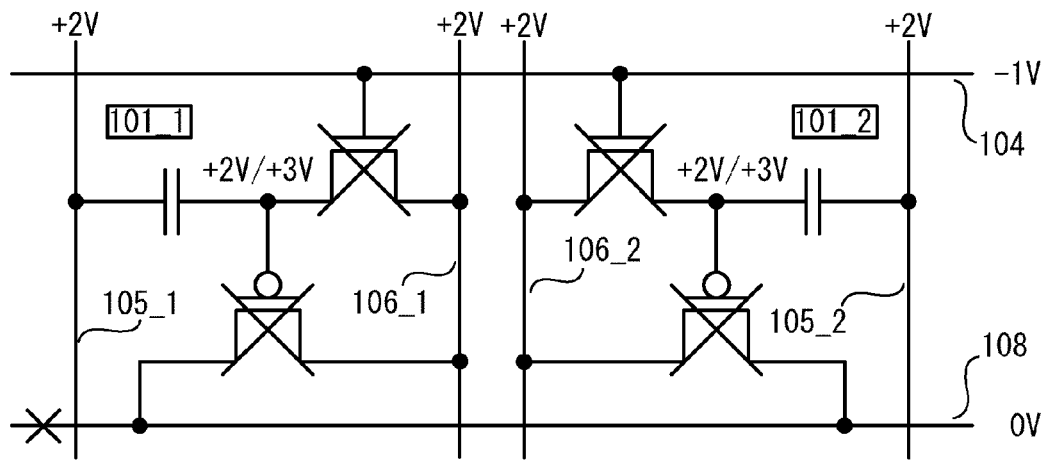
FIGS. 7A to 7C illustrate an example of a method for driving a semiconductor memory device of the present invention.
Figure 7B:
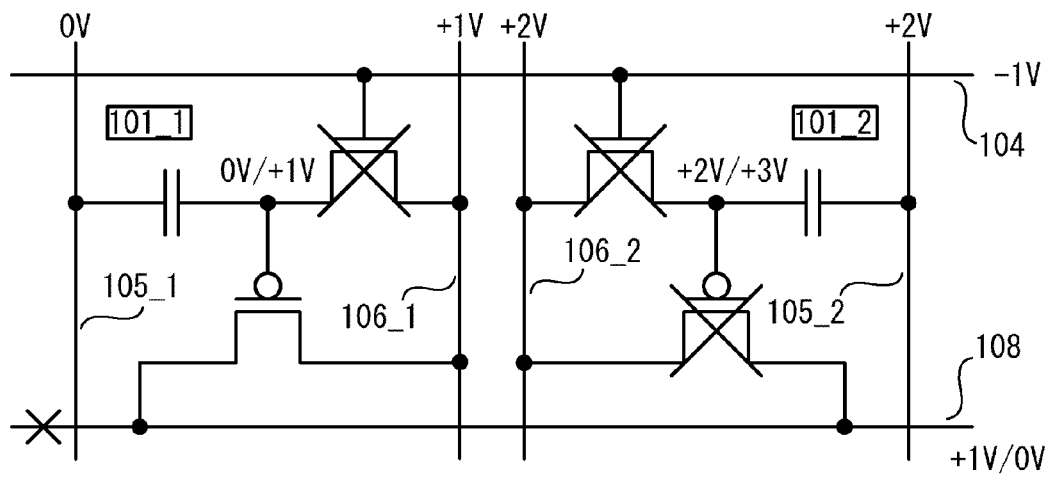
Figure 7C:
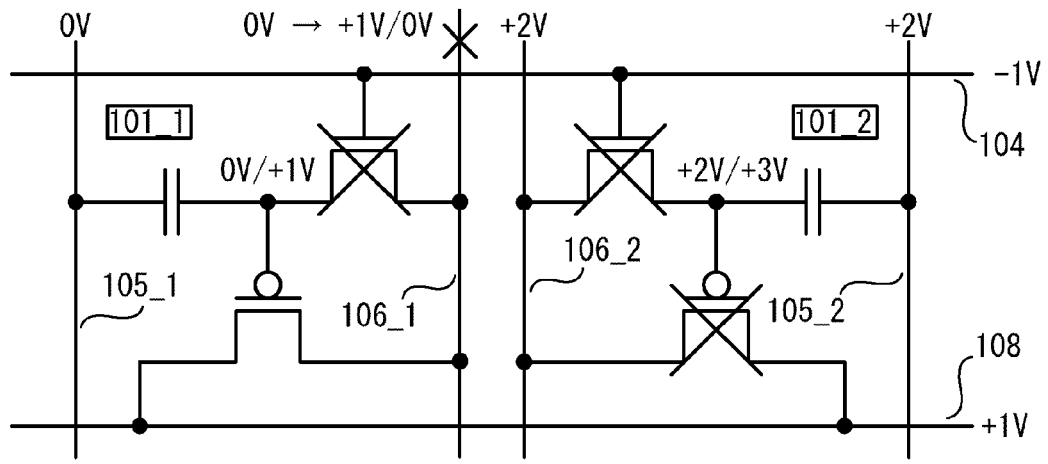
Figure 8A:
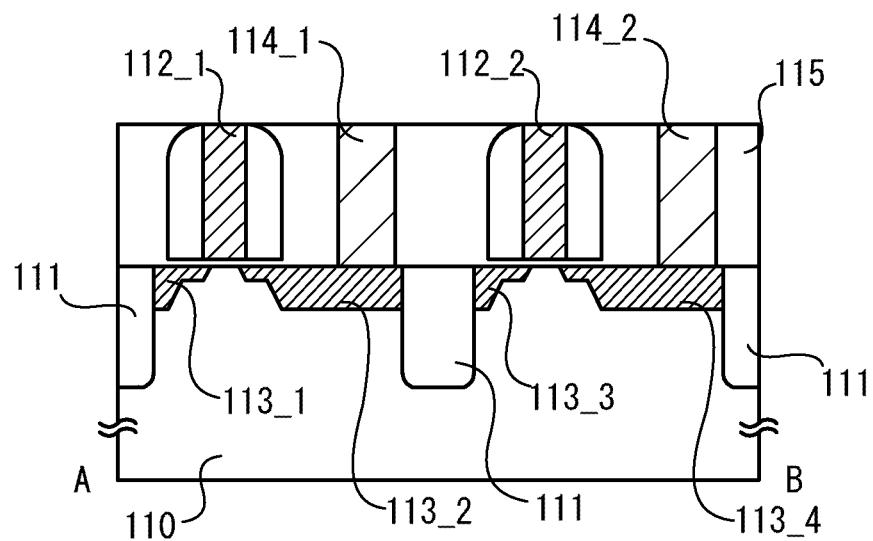
FIGS. 8A and 8B illustrate an example of steps of manufacturing a semiconductor memory device of the present invention.
Figure 8B:
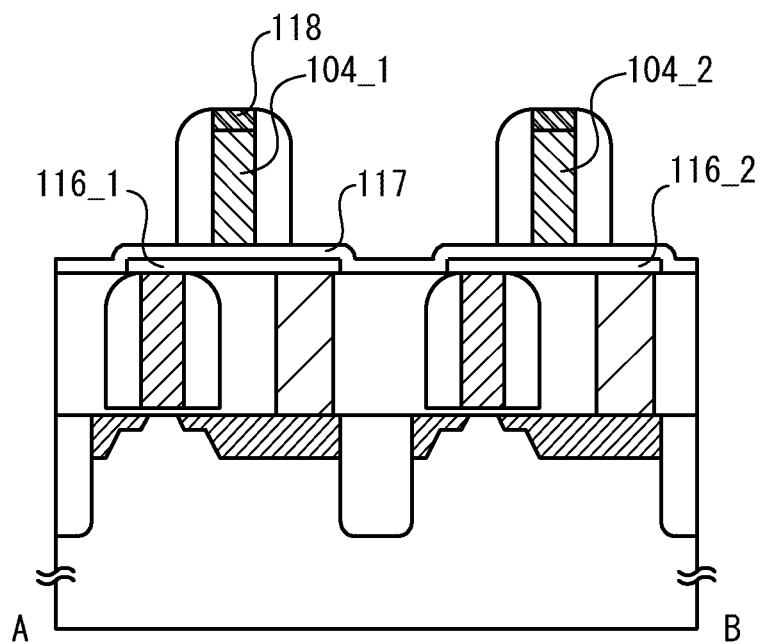
Figure 9A:
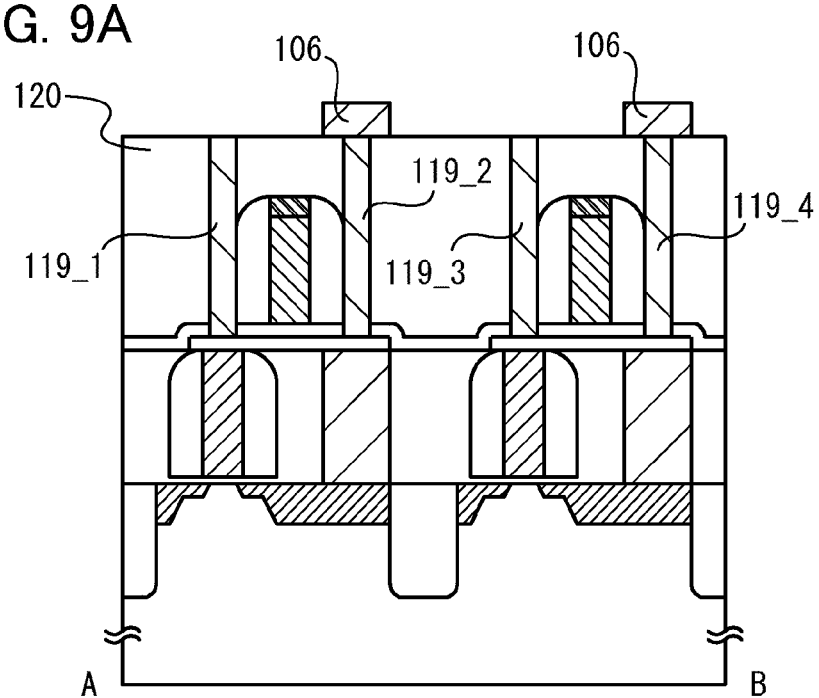
FIGS. 9A and 9B illustrate an example of steps of manufacturing a semiconductor memory device of the present invention.
Figure 9B:
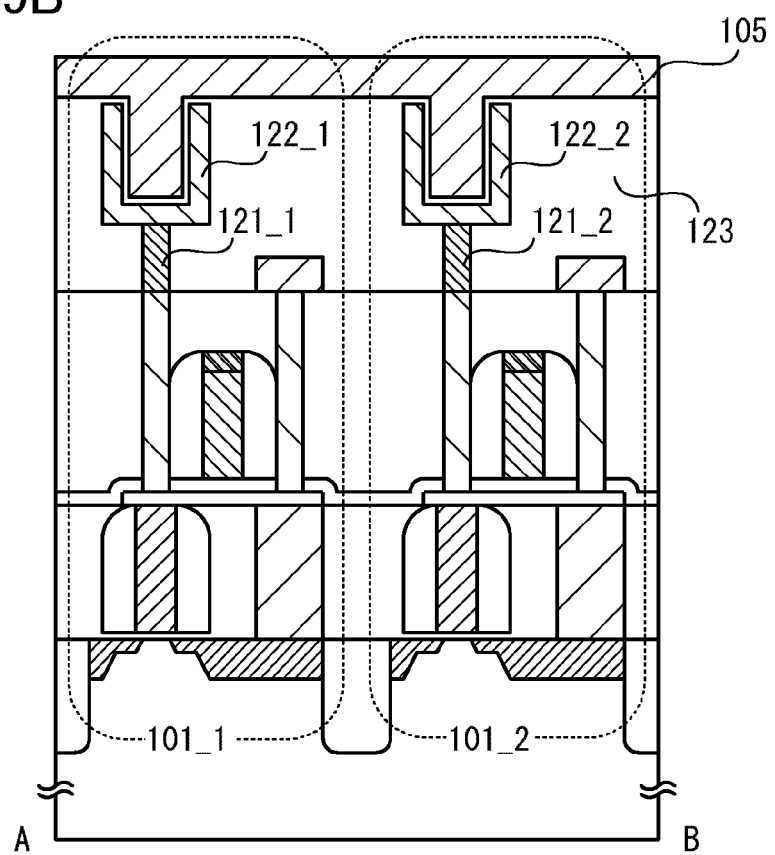

At this time, the read transistor of the memory cell 101_1 and the read transistor of the memory cell 101_2 are off because the gate potential is higher than or equal to the potential of a source or a drain in each of the read transistors (see FIG. 6A).

In this state, when the potential of the write word line 104 is increased to +2 V, the write transistor of the memory cell 101_1 is turned on while the write transistor of the memory cell 101_2 remains off. The potential of the storage node SN of the memory cell 101_1 is +1 V.

Next, the potential of the write bit line 105_1 is set to +1 V or 0 V depending on data to be written. In either case, the potential of the storage node SN of the memory cell 101_1 remains +1 V. However, a potential difference between electrodes of the capacitor in the memory cell 101_1 in accordance with the potential of the write bit line 105_1 is generated; therefore, charge based on the potential difference is held in the first electrode of the capacitor. The potential of the write bit line 105_2 connected to the memory cell 101_2 to which data is not written remains +2 V (see FIG. 6B).

After that, the potential of the write word line 104 is reduced to −1 V, so that the write transistor of the memory cell 101_1 is turned off. The charge held in the first electrode of the capacitor of the memory cell 101_1 is held in the storage node SN of the memory cell 101_1. This is the end of the writing operation.

Note that each of the potentials of the write bit lines 105_1 and 105_2 changes between 0 V and +2 V because data is written to other memory cells connected to the write bit lines 105_1 and 105_2. Accordingly, each of the potentials of the storage nodes SNs of the memory cells 101_1 and 101_2 changes between 0 V and +3 V.

However, as is clear from the above description, there is a rule because the potential of the write bit line 105 and the potential of the source line 106 are closely linked in data writing. In other words, when the potential of the source line 106 is +2 V, the potential of the write bit line 105 is +2 V and the potential of the storage node SN is accordingly +2 V or +3 V. In this case, as in the memory cell 101_1 in FIG. 6C, the read transistor is off because the gate potential of the read transistor is higher than or equal to the potential of the source or the drain.

On the other hand, when the potential of the source line 106 is +1 V, the potential of the write bit line 105 is 0 V or +1 V and the potential of the storage node SN is accordingly 0 V or +2 V. However, in this case, since the potential of the source line 106 and the potential of the read line 108 are equal (+1 V), current does not flow between the source and the drain of the read transistor, as in the memory cell 101_2 in FIG. 6C.

Next, a method for reading data will be described. First, the potentials of the write bit lines 105_1 and 105_2 are each set to +2 V, and the potentials of the source lines 106_1 and 106_2 are each set to +2 V. The potentials of the storage nodes SNs of the memory cells 101_1 and 101_2 are each +2 V or +3 V depending on the written data.

The potential of the storage node SN is higher than or equal to +2 V when the potential of the source line 106 is +2 V, and 0 V or +1 V when the potential of the source line 106 is +1 V. Accordingly, the read transistors of the memory cells 101_1 and 101_2 are off (including the state where current does not flow between a source and a drain which have the same potential) regardless of the potentials of the storage nodes SNs when the potential of the read line 108 is lower than or equal to +1 V.

Here, the potential of the source line 106 and that of the write bit line 105 are each +2 V; therefore, the read transistors of the memory cells 101_1 and 101_2 are off. The potential of the read line 108 is set to 0 V, so that the read line 108 is brought into a floating state (see FIG. 7A).

In Embodiment 1, the potentials of all the bit lines 105 need to be once reduced to 0 V in order that the read line 108 is brought into a floating state; however, such operation is not needed in this embodiment, resulting in reduction in power consumption.

For example, if data does not need to be written to or read from a memory cell connected to a bit line in a certain period, the power consumption can be lowest when potentials of a write bit line and a source line are each kept at +2 V.

In Embodiment 1, in order that the potential of the read line 108 is set to a certain potential (0 V), even a potential of a write bit line connected to a memory cell on which rewriting or reading of data does not need to be performed needs to be set to 0 V (or lower) once; thus, unnecessary power is consumed.

In contrast, since the potential of the read line 108 can be set to 0 V even with the potential of the write bit line 105_2 kept at +2 V in this embodiment, power consumption can be reduced.

Next, the potential of the write bit line 105_1 is set to 0 V and the potential of the source line 106_1 is set to +1 V. The potential of the storage node SN of the memory cell 101_1 is 0 V or +1 V. Accordingly, the read transistor of the memory cell 101_1 is in a different state depending on the potential of the storage node SN.

In the case where the potential of the storage node SN of the memory cell 101_1 is +1 V, the read transistor is off; thus, the potential of the read line 108 remains 0 V. On the other hand, in the case where the potential of the storage node SN is 0 V, the potential of the read line 108 is increased to +1 V. In other words, the potential of the read line 108 is +1 V in the case where data "1" has been written while the potential of the read line 108 is 0 V in the case where data "0" has been written.

In contrast, the potentials of the write bit line 105_2 and the source line 106_2 each remain +2 V. The potential of the storage node SN of the memory cell 101_2 is +2 V or +3 V. Accordingly, the read transistor of the memory cell 101_2 is off (see FIG. 7B).

Thus, data can be read. Note that data is not erased in the above steps of data reading. The potential of the read line is set to +1 V after data is read.

The reading operation is performed under the condition that the potential of the source line 106_1 is +1 V and that the potential of the read line 108 is 0 V in the above; however, the reading operation can also be performed under the condition that the potential of the source line 106_1 is 0 V and that the potential of the read line 108 is +1 V. Such an example is described below.

At the beginning of the reading operation, the potentials of the write bit line 105 and the source line 106 are each set to +2 V and the potential of the read line 108 is set to 0 V. Then, the potential of the read line 108 is set to +1 V. Further, the source line 106 is brought into a floating state. At this time, the read transistors of the memory cells 101_1 and 101_2 are off because the gate potential is higher than or equal to the potential of the source or the drain in each of the read transistors.

Next, the potentials of the bit line 105_1 and the source line 106_1 both connected to the memory cell 101_1 from which data is read are each set to 0 V. At this time, the potential of the storage node SN of the memory cell 101_1 is +1 V or 0 V depending on the written data.

In the case where the potential of the storage node SN is +1 V, the read transistor of the memory cell 101_1 is off; thus, the potential of the source line 106_1 remains 0 V. In contrast, in the case where the potential of the storage node SN is 0 V, the read transistor of the memory cell 101_1 is turned on; thus, the potential of the source line 106_1 is increased to +1 V (see FIG. 7C).

Thus, data can be read. Note that data is not erased in the above steps of data reading. The potential of the read line is set to 0 V after data is read.

(Embodiment 3)

Figure 10A:
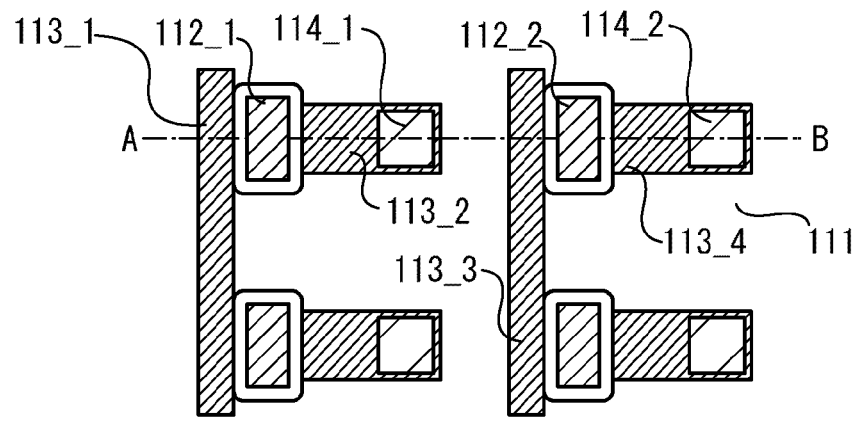
FIGS. 10A to 10C illustrate a structure of a semiconductor memory device of the present invention and manufacturing steps thereof.
Figure 10B:
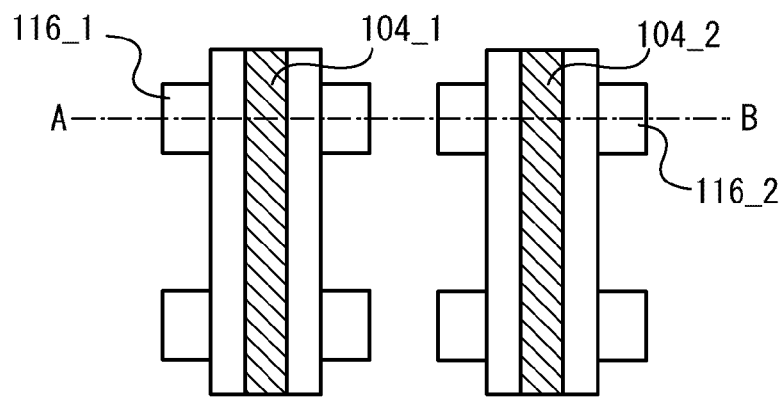
Figure 10C:
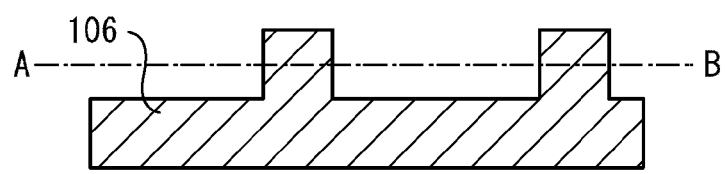
Figure 10C:
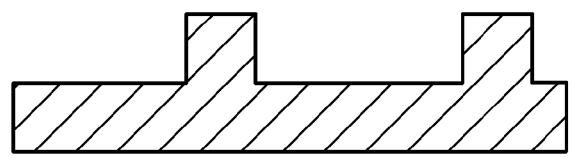

In this embodiment, steps of manufacturing the semiconductor memory device described in the above embodiment will be briefly described with reference to FIGS. 8A and 8B, FIGS. 9A and 9B, and FIGS. 10A to 10C. FIGS. 8A and 8B and FIGS. 9A and 9B are schematic cross-sectional views, and FIGS. 10A to 10C are schematic views of some of components seen from the above. Note that FIGS. 8A and 8B and FIGS. 9A and 9B are the cross-sectional views taken along dashed-dotted lines A-B in FIGS. 10A to 10C. Note that a known semiconductor manufacturing technique or Patent Document 2 can be referred to for the detail of some of the steps.

<FIG. 8A>

An element separation region 111 and the like are formed at a substrate 110 formed using a semiconductor such as silicon, gallium arsenide, gallium phosphide, or germanium. Further, read gates 112_1 and 112_2 which are gates of read transistors are formed, and impurity regions 113_1 to 113_4 are formed.

The impurity regions 113_1 and 113_3 serve as the source lines described in Embodiment 1 or 2. These regions are preferably formed in parallel to a write bit line to be described later. In other words, these regions preferably extend from the front in the depth direction in the drawing.

In the case where the impurity regions 113_1 to 113_4 are used as the source lines or the read lines, it is preferable that the resistance thereof be low; therefore, a silicide layer is preferably provided on a surface of the impurity regions 113_1 to 113_4 by a known self-aligned silicide (salicide) technique or the like.

Further, after formation of a first interlayer insulator 115, first connection electrodes 114_1 and 114_2 are formed. Then, the first connection electrodes 114_1 and 114_2 are planarized by etching until top surfaces of the read gates 112_1 and 112_2 are exposed. FIG. 10A is a view at this stage, which is seen from the above. In FIG. 10A, the element separation region 111, the read gate 112, the impurity region 113, and the first connection electrode 114 are shown.

<FIG. 8B>

Semiconductor layers 116_1 and 116_2 and a gate insulator 117 thereover are formed. A variety of semiconductors can be used as semiconductors for the semiconductor layers 116_1 and 116_2. It is preferable to use a semiconductor having a band gap of greater than or equal to 2.5 eV and a carrier concentration of lower than or equal to $10^{14}$ cm$^{-3}$. Therefore, it is preferable to use an oxide semiconductor for the semiconductor layers.

An oxide semiconductor preferably contains at least indium (In) or zinc (Zn). In particular, In and Zn are preferably contained. As a stabilizer for reducing change in characteristics of a transistor formed using the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as a Sn—Ga—Zn-based oxide, an Al—Ga—Zn-based oxide, a Sn—Al—Zn-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In:Ga:Zn. The In—Ga—Zn-based oxide may contain a metal element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values. Patent Document 2 can be referred to for the detail.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed on a flat surface. Specifically, it is preferable that the oxide semiconductor be formed on a surface with an average surface roughness ($R_a$) of 1 nm or less, preferably 0.3 nm or less.

Here, the semiconductor layer 116_1 is in contact with the read gate 112_1 and the first connection electrode 114_1, and the semiconductor layer 116_2 is in contact with the read gate 112_2 and the first connection electrode 114_2. In other words, the read gate 112_1 serves as a drain electrode of a first transistor including the semiconductor layer 116_1 as a channel, the read gate 112_2 serves as a drain electrode of a second transistor including the semiconductor layer 116_2 as a channel, the first connection electrode 114_1 serves as a source of the first transistor, and the first connection electrode 114_2 serves as a source of the second transistor.

Further, a write word line 104_1 and a write word line 104_2 are formed. It is effective in preventing short circuit between wirings to form an etching stopper 118 of an insulating material over each of top surfaces of the write word lines 104_1 and 104_2. Providing a sidewall on a side surface of the write word line 104 is also effective in preventing short circuit between wirings. Note that conductivity of the semiconductor layer 116 may be selectively increased by addition of an impurity with the use of the write word line 104 or the sidewall as a mask. FIG. 10B is a view at this stage, which is seen from the above. The semiconductor layer 116 and the write word line 104 are illustrated in FIG. 10B.

<FIG. 9A>

A second interlayer insulator 120 is formed. Then, contact holes reaching the semiconductor layers 116_1 and 116_2 are formed in the second interlayer insulator 120, and second connection electrodes 119_1 to 119_4 are formed. Further, the source line 106 is formed over the second interlayer insulator 120. FIG. 10C is a view at this stage, which is seen from the above. The source line 106 is illustrated in FIG. 10C. As is clear from FIG. 10C, the source line 106 intersects with the write word line 104.

<FIG. 9B>

Third connection electrodes 121_1 and 121_2, capacitor electrodes 122_1 and 122_2, and the like are formed in a third interlayer insulator 123, and a write bit line 105 and the like are formed over the third interlayer insulator 123. A known method for manufacturing a stacked capacitor can be referred to for the manufacturing steps. The write bit line 105 is formed in parallel to the source line 106.

Through the above steps, the memory cells 101_1 and 101_2 can be formed. The memory cells 101_1 and 101_2 are connected to the same source line. This application is based on Japanese Patent Application serial No. 2011-105132 filed with Japan Patent Office on May 10, 2011, the entire contents of which are hereby incorporated by reference.

What is claimed is:

1. A semiconductor device comprising:
   a write bit line;
   a write word line intersecting with the write bit line;
   a read line;
   a source line intersecting with the read line; and
   a memory cell,
   wherein the memory cell comprises a write transistor, a read transistor, and a capacitor,
   wherein a gate, a drain, and a source of the write transistor are connected to the write word line, one electrode of the capacitor, and the source line, respectively,
   wherein a gate, a drain, and a source of the read transistor are connected to the drain of the write transistor, the read line, and the source line, respectively,
   wherein the other electrode of the capacitor is connected to the write bit line,
   wherein a potential corresponding to a piece of data to be stored in the memory cell is configured to be supplied to the write bit line, and
   wherein the potential of the write bit line is configured to be changed when the piece of data stored in the memory cell is rewritten.

2. The semiconductor device according to claim 1, wherein the source line is formed in parallel to the write word line.

3. The semiconductor device according to claim 1, wherein a conductivity type of the write transistor is different from a conductivity type of the read transistor.

4. The semiconductor device according to claim 1, wherein off-state resistance of the write transistor is higher than or equal to $1 \times 10^{18} \Omega$.

5. A semiconductor device comprising:
   a write bit line;
   a write word line intersecting with the write bit line;
   a read line;
   a source line intersecting with the read line; and
   a memory cell,
   wherein the memory cell comprises a write transistor, a read transistor, and a capacitor,
   wherein a gate, a drain, and a source of the write transistor are connected to the write word line, one electrode of the capacitor, and the source line, respectively,
   wherein the other electrode of the capacitor is connected to the write bit line,
   wherein a gate, a drain, and a source of the read transistor are connected to the drain of the write transistor, the read line, and the source line, respectively,
   wherein the source line is in parallel to the write bit line,
   wherein a potential corresponding to a piece of data to be stored in the memory cell is configured to be supplied to the write bit line, and
   wherein the potential of the write bit line is configured to be changed when the piece of data stored in the memory cell is rewritten.

6. The semiconductor device according to claim 5, wherein a conductivity type of the write transistor is different from a conductivity type of the read transistor.

7. The semiconductor device according to claim 5, wherein off-state resistance of the write transistor is higher than or equal to $1 \times 10^{18} \Omega$.

8. A method for driving a semiconductor device, the semiconductor device comprising:
   a write bit line;
   a write word line intersecting with the write bit line;
   a read line;
   a source line intersecting with the read line; and
   a memory cell,
   wherein the memory cell comprises a write transistor, a read transistor, and a capacitor,
   wherein a gate, a drain, and a source of the write transistor are connected to the write word line, one electrode of the capacitor, and the source line, respectively,
   wherein a gate, a drain, and a source of the read transistor are connected to the drain of the write transistor, the read line, and the source line, respectively,
   wherein the other electrode of the capacitor is connected to the write bit line,
   wherein a potential corresponding to a piece of data to be stored in the memory cell is configured to be supplied to the write bit line,
   wherein the potential of the write bit line is configured to be changed when the piece of data stored in the memory cell is rewritten, and
   wherein a potential of the source line is kept constant during data reading and data writing.

9. The method for driving the semiconductor device according to claim 8, wherein the source line is formed in parallel to the write word line.

10. The method for driving the semiconductor device according to claim 8, wherein a conductivity type of the write transistor is different from a conductivity type of the read transistor.

11. The method for driving the semiconductor device according to claim 8, wherein off-state resistance of the write transistor is higher than or equal to $1 \times 10^{18} \Omega$.

12. A method for driving a semiconductor device, the semiconductor device comprising:
   a write bit line;
   a write word line intersecting with the write bit line;
   a read line;
   a source line intersecting with the read line; and
   a memory cell,
   wherein the memory cell comprises a write transistor, a read transistor, and a capacitor,
   wherein a gate, a drain, and a source of the write transistor are connected to the write word line, one electrode of the capacitor, and the source line, respectively,
   wherein a gate, a drain, and a source of the read transistor are connected to the drain of the write transistor, the read line, and the source line, respectively,
   wherein the other electrode of the capacitor is connected to the write bit line,
   wherein a potential corresponding to a piece of data to be stored in the memory cell is configured to be supplied to the write bit line,
   wherein the potential of the write bit line is configured to be changed when the piece of data stored in the memory cell is rewritten, and wherein potentials of the drain and the source of the write transistor immediately after writing of the piece of data are equal to potentials of the drain and the source of the write transistor immediately after writing of another piece of data.

13. The method for driving the semiconductor device according to claim 12, wherein the source line is formed in parallel to the write word line.

14. The method for driving the semiconductor device according to claim 12, wherein a conductivity type of the write transistor is different from a conductivity type of the read transistor.

15. The method for driving the semiconductor device according to claim 12, wherein off-state resistance of the write transistor is higher than or equal to $1\times10^{18}\Omega$.

16. A method for driving a semiconductor device, the semiconductor device comprising:
- a write bit line;
- a write word line intersecting with the write bit line;
- a read line;
- a source line intersecting with the read line; and
- a memory cell,
- wherein the memory cell comprises a write transistor, a read transistor, and a capacitor,
- wherein a gate, a drain, and a source of the write transistor are connected to the write word line, one electrode of the capacitor, and the source line, respectively,
- wherein the other electrode of the capacitor is connected to the write bit line,
- wherein a gate, a drain, and a source of the read transistor are connected to the drain of the write transistor, the read line, and the source line, respectively,
- wherein the source line is in parallel to the write bit line,
- wherein a potential corresponding to a piece of data to be stored in the memory cell is configured to be supplied to the write bit line,
- wherein the potential of the write bit line is configured to be changed when the piece of data stored in the memory cell is rewritten, and
- wherein a potential of the source line is kept constant during data reading and data writing.

17. The method for driving the semiconductor device according to claim 16, wherein a conductivity type of the write transistor is different from a conductivity type of the read transistor.

18. The method for driving the semiconductor device according to claim 16, wherein off-state resistance of the write transistor is higher than or equal to $1\times10^{18}\Omega$.

19. A method for driving a semiconductor device, the semiconductor device comprising:
- a write bit line;
- a write word line intersecting with the write bit line;
- a read line;
- a source line intersecting with the read line; and
- a memory cell,
- wherein the memory cell comprises a write transistor, a read transistor, and a capacitor,
- wherein a gate, a drain, and a source of the write transistor are connected to the write word line, one electrode of the capacitor, and the source line, respectively,
- wherein the other electrode of the capacitor is connected to the write bit line,
- wherein a gate, a drain, and a source of the read transistor are connected to the drain of the write transistor, the read line, and the source line, respectively,
- wherein the source line is in parallel to the write bit line,
- wherein a potential corresponding to a piece of data to be stored in the memory cell is configured to be supplied to the write bit line,
- wherein the potential of the write bit line is configured to be changed when the piece of data stored in the memory cell is rewritten, and
- wherein potentials of the drain and a source of the write transistor immediately after writing of the piece of data are equal to potentials of the drain and the source of the write transistor immediately after writing of another piece of data.

20. The method for driving the semiconductor device according to claim 19, wherein a conductivity type of the write transistor is different from a conductivity type of the read transistor.

21. The method for driving the semiconductor device according to claim 19, wherein off-state resistance of the write transistor is higher than or equal to $1\times10^{18}\Omega$.

* * * * *